(12) United States Patent
Fujii et al.

(10) Patent No.: US 11,257,702 B2
(45) Date of Patent: Feb. 22, 2022

(54) POWER SUPPLY APPARATUS FOR ELECTROSTATIC CHUCK AND SUBSTRATE CONTROL METHOD

(71) Applicant: ULVAC TECHNO, LTD., Kanagawa (JP)

(72) Inventors: Katsunori Fujii, Kanagawa (JP); Masanori Ito, Kanagawa (JP); Yasushi Iwata, Shizuoka (JP)

(73) Assignee: ULVAC TECHNO, LTD., Kanagawa (JP)

( * ) Notice: Subject to any disclaimer, the term of this patent is extended or adjusted under 35 U.S.C. 154(b) by 0 days.

(21) Appl. No.: 16/970,014

(22) PCT Filed: May 8, 2019

(86) PCT No.: PCT/JP2019/018354
§ 371 (c)(1),
(2) Date: Aug. 14, 2020

(87) PCT Pub. No.: WO2020/003746
PCT Pub. Date: Jan. 2, 2020

(65) Prior Publication Data
US 2020/0411356 A1    Dec. 31, 2020

(30) Foreign Application Priority Data

Jun. 28, 2018    (JP) .............................. JP2018-123735

(51) Int. Cl.
*H01L 21/683*    (2006.01)
*H02N 13/00*    (2006.01)
(Continued)

(52) U.S. Cl.
CPC ........ *H01L 21/6833* (2013.01); *H01L 21/683* (2013.01); *H02N 13/00* (2013.01);
(Continued)

(58) Field of Classification Search
CPC ............... H01L 21/683; H01L 21/6833; H01L 21/02164; H01L 21/0217; H01L 21/6831;
(Continued)

(56) References Cited

U.S. PATENT DOCUMENTS 5,325,261 A    6/1994  Horwitz
7,558,045 B1 *  7/2009  Onate ............... H01L 21/67259
                                                        361/234
(Continued)

FOREIGN PATENT DOCUMENTS

JP    01-321136 A    12/1989
JP    5-36806 A    2/1993
(Continued)

OTHER PUBLICATIONS

International Search Report for PCT Patent App. No. PCT/JP2019/018354 (dated Jul. 16, 2019).

*Primary Examiner* — Danny Nguyen
(74) *Attorney, Agent, or Firm* — Cermak Nakajima & McGowan LLP; Tomoko Nakajima

(57) ABSTRACT

The power supply apparatus for the electrostatic chuck of this invention has: DC power source units for applying DC voltage to electrodes of the electrostatic chuck; and an AC power source unit for causing AC current to flow through an electrostatic capacitance of the electrostatic chuck. Provided that: a circuit for charging an electrode, from DC power source unit, with chuck voltage in order to attract and hold in position the to-be-processed substrate with the electrostatic chuck, be defined as a first circuit and that; a circuit for clearing charges of the to-be-processed substrate be defined as a second circuit, the power supply apparatus further includes switching means for switching between the first
(Continued)

circuit and the second circuit. The second circuit is provided with an AC power source unit and a voltmeter for measuring AC voltage.

4 Claims, 4 Drawing Sheets

(51) Int. Cl.
  *H01L 21/02* (2006.01)
  *G06F 11/30* (2006.01)
(52) U.S. Cl.
  CPC ........ *G06F 11/30* (2013.01); *H01L 21/02164* (2013.01); *H01L 21/6831* (2013.01); *H01L 21/6838* (2013.01)
(58) Field of Classification Search
  CPC .......... H01L 21/67103; H01L 21/6838; H02N 13/00; G06F 11/30
  USPC ......................................................... 361/234
  See application file for complete search history.

(56) References Cited

U.S. PATENT DOCUMENTS

| | | |
|---|---|---|
| 9,209,001 B2 | 12/2015 | Morimoto et al. |
| 2002/0086546 A1 | 7/2002 | Yamashita et al. |
| 2008/0055813 A1* | 3/2008 | Son .................... H01L 21/6833 361/234 |
| 2011/0201139 A1 | 8/2011 | Ishida et al. |
| 2020/0008016 A1 | 1/2020 | Wu et al. |

FOREIGN PATENT DOCUMENTS

| | | |
|---|---|---|
| JP | 7-29968 A | 1/1995 |
| JP | 11-67885 A | 3/1999 |
| JP | 2002-203837 A | 7/2002 |
| JP | 2011-018849 A | 1/2011 |
| JP | 2011-515856 A | 5/2011 |
| WO | WO2010/041409 A1 | 4/2010 |
| WO | WO2011/125292 A1 | 10/2011 |

* cited by examiner

POWER SUPPLY APPARATUS FOR ELECTROSTATIC CHUCK AND SUBSTRATE CONTROL METHOD

This application is a national phase entry under 35 U. S.C. § 371 of PCT Patent Application No. PCT/JP2019/0918354, filed on May 8, 2019, which claims priority under 35 U.S.C. § 119 to Japanese Patent Application No. 2018-123735, filed Jun. 28, 2018, both of which are incorporated by reference.

TECHNICAL FIELD

The present invention relates to a power supply apparatus for an electrostatic chuck, and also to a substrate control method for controlling electrostatic attraction and releasing of a substrate to and from the electrostatic chuck.

BACKGROUND ART

In the steps of manufacturing semiconductors, in order to obtain desired device structures, various kinds of processing are performed on a substrate that is to be processed (also referred to as "a to-be-processed substrate") such as silicon wafer, glass substrate, and the like, the various kinds of processing being, e.g., film-forming processing by sputtering method, plasma CVD method, and the like, thermal processing, ion-injection processing, etching processing, and the like. The processing apparatus for performing the above-mentioned kinds of processing is provided with an electrostatic chuck for holding in position, inside a vacuum chamber in vacuum atmosphere, a to-be-processed substrate. The electrostatic chuck has: a base which is made, e.g., of a metal; and a ceramic plate (chuck plate) made, e.g., of pyrolytic boron nitride (PBN), the ceramic plate being mounted on the surface of the base. The chuck plate has buried therein a pair of electrodes (so-called bipolar type). Then, there is used a power supply apparatus for applying DC voltage (chuck voltage) to the pair of the electrodes. It is thus so arranged that the to-be-processed substrate is attracted and held in position (chuck operation) to the surface of the chuck plate by the electrostatic force that is generated by applying DC voltage to both the electrodes.

It is to be noted here that, by repeating the electrostatic attraction and releasing of the to-be-processed substrate to and from the chuck plate, the surface of the chuck plate gets abraded by the to-be-processed substrate and will be gradually worn. Then, if the chuck plate has been worn, there will occur poor or insufficient attraction of the to-be-processed substrate at the time of attraction of the to-be-processed substrate to the surface of the chuck plate or during the processing. In this state, normal processing cannot be performed on the to-be-processed substrate. As a solution, it is publicly known (see, for example, Patent Document 1) that the power supply apparatus is further provided with: an AC power source unit which causes AC current to flow through the electrostatic capacitance of the chuck plate; and a measuring device for measuring the voltage and the like at the time of flowing of the AC current so as to ascertain, by thus monitoring the values measured by the measuring device, the state of the to-be-processed substrate such as the occurrence of insufficient attraction and the like. The AC power source unit is ordinarily provided with a transformer, and the secondary side of the transformer is interposed in the positive output (high-voltage side) of the DC power source unit. It is thus so arranged that the AC current is caused to flow in a state of being superimposed on the DC voltage that is applied to a pair of electrodes in order to attract the to-be-processed substrate.

By the way, there is a case in which the to-be-processed substrate which is placed in position on the chuck plate and which is before processing, has already given rise to cracking or chipping. Or else, there is a case in which the to-be-processed substrate has given rise to positional deviation relative to the chuck plate of the electrostatic chuck for one reason or another during transfer of the substrate. Aside from these cracking, chipping and displacement, there is a case in which a foreign matter may have been interposed when the to-be-processed substrate has been placed in position on the chuck plate. In this kind of case there will also occur insufficient attraction. Further, in case the to-be-processed substrate, after having been processed, has still electrostatic charge, if the to-be-processed substrate is removed by force from the chuck plate while the charge clearing thereof is insufficient, there is a case in which cracking or chipping may occur to the to-be-processed substrate, or positional deviation may occur. For the above-mentioned reasons, in order to control the attraction and releasing of the to-be-processed substrate to and from the electrostatic chuck, it is desirable to be able to ascertain the state of the to-be-processed substrate. However, in the above-mentioned conventional example, there is a problem in that the state of the to-be-processed substrate cannot be ascertained by causing the AC current to flow except when the DC voltage is applied to the pair of electrodes.

PRIOR ART DOCUMENTS

Patent Documents

Patent Document 1: Re-publication WO2011/125292

SUMMARY OF THE INVENTION

Problems that the Invention is to Solve

This invention has been made taking the above points into consideration. In view of the above points, this invention has a problem of providing a power supply apparatus for an electrostatic chuck and a substrate control method which enables to ascertain the state of the to-be-processed substrate relative to the electrostatic chuck in a series of operations of: placing in position a to-be-processed substrate on an electrostatic chuck; thereafter attracting the to-be-processed substrate and performing processing thereon; releasing the attraction after processing and then transferring the to-be-processed substrate.

Means for Solving the Problems

In order to solve the above-mentioned problems, there is provided a power supply apparatus for supplying electric power to an electrostatic chuck which holds by attraction a to-be-processed substrate in a vacuum chamber. The power supply apparatus comprises: a DC power source unit for applying DC voltage to an electrode disposed in the electrostatic chuck; an AC power source unit for causing AC current to flow through an electrostatic capacitance of the electrostatic chuck; provided that a circuit for charging an electrode, from the DC power source unit, with chuck voltage to attract and hold in position the to-be-processed substrate be defined as a first circuit and that a circuit for charge clearing the to-be-processed substrate be defined as a second circuit, a switching means for switching between the first circuit and the second circuit. The second circuit is provided with the AC power source unit and a measuring device for measuring the AC current or the DC voltage.

According to this invention, in case a predetermined (plasma) processing is performed on the to-be-processed substrate in a processing apparatus, first, in a state in which switching has been made by the switching means to the second circuit, the to-be-processed substrate such as a silicon wafer, a glass substrate, and the like is mounted in position on the surface of the electrostatic chuck. Then, AC current is caused, by the AC power source unit, to flow through the electrostatic capacitance of the electrostatic chuck, and an AC current value or an AC voltage value at that time is measured by the measuring device. According to this arrangement: if the to-be-processed substrate has given rise to cracking or chipping; if the to-be-processed substrate has given rise to warping; if the to-be-processed substrate may have given rise to the positional deviation; or if a foreign matter has been interposed when the to-be-processed substrate is placed in position on the electrostatic chuck, the measurement values may change as a result of a change in electrostatic capacitance due to the change in the area of contact between the electrostatic chuck and the to-be-processed substrate. By comparing these measurement values with the AC current value or AC voltage value empirically measured in advance, the state of the to-be-processed substrate prior to the processing can be ascertained prior to attraction, so that a judgment can be made as to whether the attraction of the to-be-processed substrate can be made or not.

Then, when switching is made by the switching means to the first circuit, the electrode is applied with chuck voltage so that the to-be-processed substrate will be attracted by the electrostatic force and is held in position (chucked) to the surface of the electrostatic chuck. After the to-be-processed substrate has been attracted, AC current is caused to flow by the AC power source unit through the electrostatic capacitance of the electrostatic chuck and an AC current value or an AC voltage value at this time is measured by the measuring device. Then, by comparing this measured value, in a manner similar to the above, with the empirically measured AC current value or AC voltage value obtained in advance, judgment can be made as to: whether the attraction of the to-be-obtained substrate has been normally made to the surface of the electrostatic chuck or; whether, during the time of performing a predetermined processing on the to-be-obtained substrate, cracking or chipping of to-be-obtained substrate has occurred or not.

Then, once a predetermined processing has been finished, switching is made by the switching means to the second circuit. For example, the electrode is connected to the ground potential or, in case of a dipolar type of electrostatic chuck, both the electrodes are connected together so that the pair of electrodes become the same electric potential. In this manner, the to-be-processed substrate that has been electrostatically charged as a result of performing a predetermined processing can be cleared of electrostatic charging. At this time, the AC power source unit causes AC current to flow through the electrostatic capacitance of the electrostatic chuck, or the AC current value or AC voltage value at that time is measured by the measuring device. Then, if the to-be-processed substrate is, for example, locally lifted from the electrostatic chuck, the electrostatic capacitance will vary. In the same manner as above, by comparing this measured current value with the AC current value or the DC voltage value empirically measured in advance, a judgment can be made as to whether the charge clearing of the to-be-processed substrate is sufficient or not. Depending on the result of the judgment, the to-be-processed substrate can be lifted, e.g., by lifting pins, off from the electrostatic chuck, thereby completely releasing the to-be-processed substrate.

According to this invention as noted above, during a series of operations, after the to-be-processed substrate has been placed on the electrostatic chuck, of attracting the to-be-processed substrate and performing processing thereon, releasing the attraction after processing and then transferring the to-be-processed substrate, the state of the to-be-processed substrate can be ascertained, so that the state of the to-be-processed substrate relative to the electrostatic chuck can be ascertained. Not only can the control be made over the attraction and releasing of the to-be-processed substrate to and from the electrostatic chuck before and after processing, but also can the cracking and chipping that may occur to the to-be-processed substrate during processing, be detected. Here, in case a chuck plate made, e.g., of silicon rubber is used as the electrostatic chuck, it is necessary to raise the chuck voltage relatively high (e.g., 4 kV) at the time of electrostatically attracting the to-be-processed substrate. In this case, if the secondary side of the transformer of the AC power source unit is interposed in the positive (high-voltage side) output of the DC power source unit, a high dielectric strength transformer will be required. This kind of transformer is large in size and cannot be packaged on a circuit substrate. Therefore, there is a problem in that a power supply apparatus for the electrostatic chuck becomes large in size. On the other hand, as in this invention, if the DC power source unit is disposed in the second circuit (in other words, low-voltage side of DC power supply), there is no need of a high dielectric strength transformer and is therefore advantageous in an attempt to downsize the apparatus.

In this invention, when AC current is caused to flow through the electrostatic capacitance of the electrostatic chuck to measure the AC current value or AC voltage value at that time, in order to minimize the effect of the noises, there may be employed an arrangement in which, when the electrode is constituted by a pair of electrodes, the positive and negative outputs of the DC power source unit are respectively connected to each of the electrodes through the switching means, and the second circuits have disposed in series two of the AC power source units. In such a case, resistors may be disposed in series between both the AC power source units, and a voltmeter as the measuring device is connected in parallel with the resistors.

Further, in order to solve the above-mentioned problems, the substrate control method for controlling attraction and releasing of a substrate to and from the electrostatic chuck by using the power supply apparatus for the above-mentioned electrostatic chuck comprises the step of; placing in position a to-be-processed substrate on the surface of the electrostatic chuck in a state in which switching has been made by the switching means to the second circuit; causing AC current by the AC power source unit to flow through the electrostatic capacitance, measuring by the measuring device AC current or AC voltage at this time; and, when the measured value is within a predetermined range, allowing DC voltage to be applied to the electrode. It also comprises the step of: switching by the switching means to the first circuit to apply chuck voltage from the DC power source unit to the electrode, thereby holding by attraction the to-be-processed substrate that is placed on the surface of the electrostatic chuck; after attraction, causing AC current to flow, by the AC power source unit, through the electrostatic capacitance of the electrostatic chuck; measuring by the measuring device AC current or AC voltage at this time to judge whether the measured value is within a predetermined range. It further comprises the step of: switching by the switching means to the second circuit for charge clearing the to-be-processed substrate and causing AC current to flow, by the AC power source unit, through the electrostatic capacitance of the electrostatic chuck; measuring by the measuring device AC current or AC voltage at this time; and, when this measured value is within a predetermined range, allowing the releasing of the to-be-processed substrate from the electrostatic chuck.

MODES FOR CARRYING OUT THE INVENTION

With reference to the drawings, a description will now be made of an embodiment of a power supply apparatus and of a substrate control method using the power supply apparatus, provided that a substrate to be processed is defined to be a silicon wafer (hereinafter referred to as "wafer W") and that the electrostatic chuck is of a bipolar type which attracts the wafer W to its surface. In the following, a description will be made of the direction such as "up" and "down" on the basis of the posture of the electrostatic chuck as shown in FIG. 1.

Figure 1:
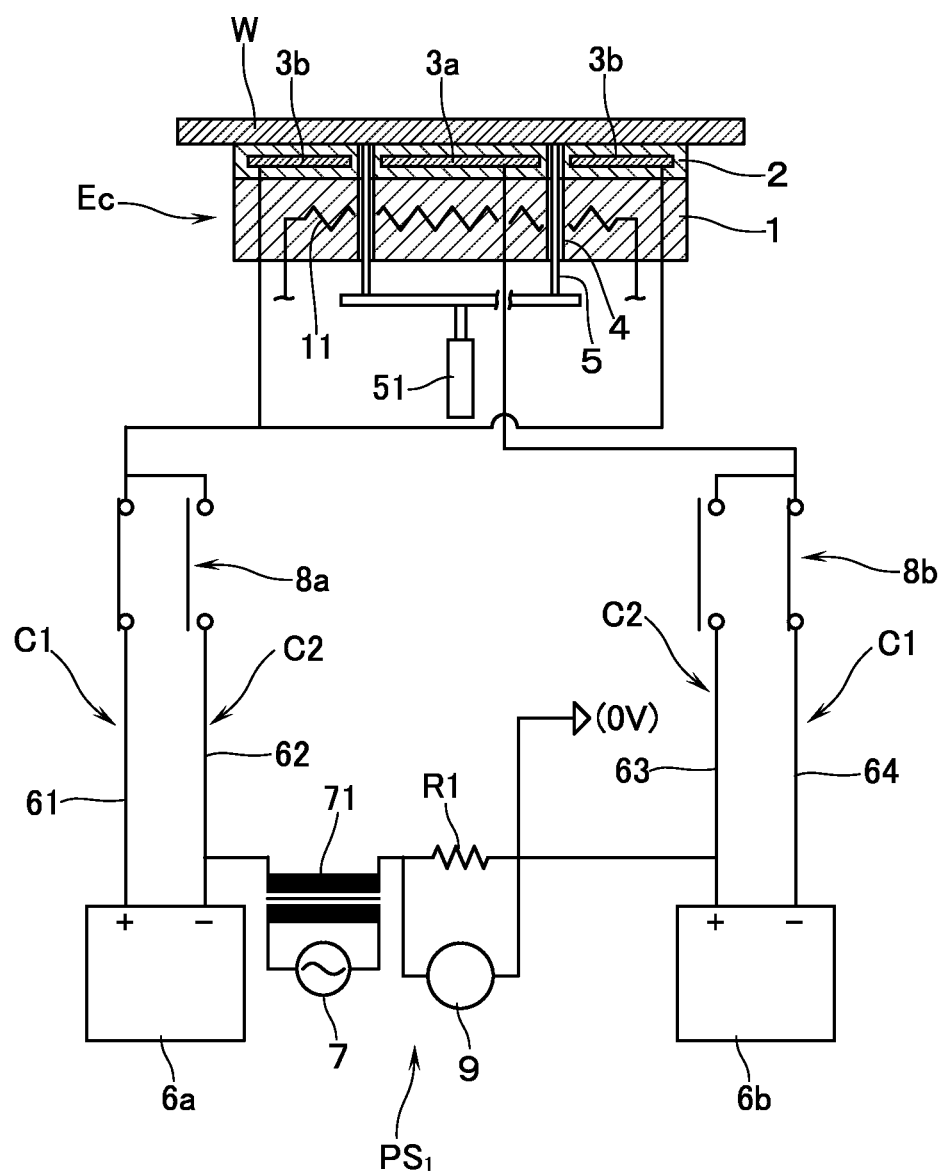
FIG. 1 schematically shows an arrangement of a power supply apparatus for an electrostatic chuck relating to an embodiment of this invention.

With reference to FIG. 1, reference mark Ec is an electrostatic chuck which is applied with electricity by a power supply apparatus of this embodiment. The electrostatic chuck Ec is disposed inside a vacuum chamber of a processing apparatus (not illustrated) which performs various kinds of processing such as film-forming processing by sputtering method, plasma CVD method, and the like, thermal processing, ion-injection processing, etching processing, and the like. It is then so arranged that the electrostatic chuck holds in position the wafer W inside the vacuum chamber. By the way, since the processing apparatus itself is used out of a known one, a detailed description thereof will be omitted here.

The electrostatic chuck Ec is constituted by a metallic base 1, and a chuck plate 2 which is a dielectric disposed on an upper surface of the base 1. As the base 1, use is made of one which is constituted by a cylindrical body of aluminum make and having a profile corresponding to the wafer W. On the inside of the base 1 there are disposed a heating means 11 for heating the wafer W, a cooling means (not illustrated) for cooling the wafer W by circulating the coolant so that the wafer W can be heated or cooled during processing. On the other hand, as the chuck plate 2, use is made of one made of PBN, ALN or silicon rubber. Inside the chuck plate 2 there are disposed a pair of electrodes 3a, 3b through an electrically insulating layer (not illustrated). Further, the base 1 and the chuck plate 2 of the electrostatic chuck Ec have formed therethrough a plurality of through holes 4 penetrating in the up and down direction. In each of the through holes 4 there is inserted a lifting pin 5, respectively. The lifting pins 5 are arranged to be freely movable up and down by driving means 51 such as air cylinder and the like so as to be projecting or recessing relative to the chuck plate 2. Then, in order to apply DC voltage (voltage for the chuck) to both the electrodes 3a, 3b and in order to ascertain the state of the wafer W when it is absorbed to the chuck plate 2 of the electrostatic chuck Ec, the power supply apparatus $PS_1$ of this embodiment is used.

The power supply apparatus $PS_1$ is provided with DC power source units 6a, 6b for applying DC voltage (chuck voltage) to a pair of electrodes 3a, 3b; and an AC power source unit 7 for causing AC current to flow through the electrostatic capacitance of the chuck plate 2. In addition, provided that: a circuit for applying DC voltage to the DC power source units 6a, 6b and both the electrodes 3a, 3b in order to hold by attraction the wafer W by means of the chuck plate 2 is defined as a first circuit C1 and that; a circuit for connecting both the electrodes 3a, 3b to the ground potential in order to charge clear the wafer W after processing is defined as a second circuit C2, the power supply apparatus $PS_1$ is further provided with switching means 8a, 8b for switching between the first circuit C1 and the second circuit C2. In other words, in the first circuit C1, as shown in FIG. 1, positive (high-voltage side) output 61 of one 6a of the DC power source unit is connected through one 8a of the switching means to one 3b of the electrodes, and the other electrode 3a is connected through the other switching means 8b to negative (low-voltage side) output 64 of the other 6b of the DC power source unit. According to this arrangement, DC voltage is applied to both the electrodes 3a, 3b in order to hold by attraction the wafer W by means of the chuck plate 2. When both the switching means 8a, 8b are switched over, one 3b of the electrodes is connected to the negative output 62 of one 6a of the DC power source units through one 8a of the switching means and, at the same time, the other 3a of the electrodes is connected to the positive output 63 of the other 6b of the DC power source units through the other 8b of the switching means, thereby being connected to the ground potential.

As the DC power source units 6a, 6b there will be utilized a known one which can apply DC voltage of a range of 0.1 kV and 4 kV to both the electrodes 3a, 3b depending on the kind of chuck plate 2. By the way, in this embodiment, a description will be made of an example in which two DC power source units 6a, 6b are used, but this invention shall not be limited to the above. For example, a single piece of known DC power source unit may also be utilized. Although not described by particularly illustrating, the AC power source unit 7 is provided with a power supply which generates AC voltage of a predetermined frequency, and a transformer 71. The secondary side of the transformer 71 is interposed between the negative output 62 of one 6a of the DC power source unit of the second circuit C2 and the positive output 63 of the other 6b of the DC power source unit, and is connected to the ground potential (OV) through a resistor R1. A voltmeter 9 which serves as a measuring device to measure the AC voltage is connected in parallel with the resistor R1. As the switching means 8a, 8b there is utilized known ones such as relays and the like. According to this arrangement, in either state of the first circuit C1 and the second circuit C2, it becomes possible to cause the AC current to flow so that the AC voltage at that time can be measured by the voltmeter 9. By the way, it is so arranged that an overall control of the operations of the DC power source units 6a, 6b, AC power source unit 7, and switching means 8a, 8b can be made by a control unit (not illustrated). A description will hereinafter be made of a substrate control method which uses the power supply apparatus $PS_1$ as shown in FIG. 1.

In case a predetermined (plasma) processing is performed on a wafer W by a processing apparatus (not illustrated), first, the wafer W is placed in position on the surface of the electrostatic chuck Ec in a state in which the switching has been made to the second circuit C2 by the switching means 8a, 8b. In this case, the lifting pins 5 are moved to a position protruding above the upper surface of the chuck plate 2. In this state, the wafer W is transferred by a transfer robot (not illustrated) so as to hand it over to the lifting pins 5. Then, when the lifting pins 5 are moved to a position of immersion into the chuck plate 2, the wafer W is placed on the upper surface of the chuck plate 2. At this time, AC voltage to pass through the electrostatic capacitance of the chuck plate 2 is caused to flow by the AC power source unit 7 and the voltage value at that time is measured by the voltmeter 9. According to this arrangement, should such a thing happen as the wafer be subject to cracking or chipping, or should the wafer W be warped, or should the wafer W has given rise to positional deviation relative to the chuck plate 2, or further should a foreign matter be interposed when the wafer W is placed on the chuck plate 2, the measured AC voltage value will vary accompanied by the change in the electrostatic capacitance due to the change in the contact area between the chuck plate 2 and the wafer W. By comparing this measured AC voltage value (measured value) with the AC voltage value empirically measured in advance, the state of the wafer W, before processing, that is placed on the chuck plate 2 can be ascertained prior to attraction, so that a judgment can be made as to whether attraction of the wafer W is acceptable or not.

Subsequently, in case the measured AC voltage value is within a predetermined range, applying DC voltage to the pair of electrodes 3a, 3b is allowed. In this case, by switching to the first circuit C1 by the switching means 8a, 8b, DC voltage is applied to both the electrodes 3a, 3b. By means of the electrostatic force to be generated between both the electrodes 3a, 3b, the wafer W is attracted and held in position (chucked) to the upper surface of the chuck plate 2. After attraction of the wafer W, AC current is caused to flow through the electrostatic capacitance of the chuck plate 2 by means of the AC power source unit 7, and the AC voltage at this time is measured by the volt meter 9. In the manner similar to the above, by comparing this measured AC voltage value with the AC voltage value empirically measured in advance, i.e., if a judgment is made as to whether the measured AC voltage value falls within a predetermined range or not, it can be judged as to whether the attraction of the wafer W to the upper surface of the chuck plate 2 has been made normally or not, or as to whether cracking or chipping of the wafer W has occurred or not during the time of making a predetermined processing on the wafer W.

Finally, when the processing has been finished in a state in which the measured AC voltage value lies within a predetermined range, switching is made by the switching means 8a, 8b to the second circuit C2, so that both the electrodes 3a, 3b are connected to the ground potential. According to this arrangement, the wafer W that may have been electrostatically charged as a result of processing using, e.g., plasma will be cleared of charging. At this time, AC current is caused by the AC power source unit 7 to flow through the electrostatic capacitance of the chuck plate 2 and the AC voltage at that time is measured by the voltmeter 9. Then, if the wafer W is locally floated off, e.g., from the upper surface of the chuck plate 2, the electrostatic capacitance may change. Therefore, in the manner similar to the above, by comparing this measured AC voltage value with the AC voltage value empirically measured in advance, the state of the wafer W can be ascertained, prior to the transferring of the processed wafer W, inclusive of whether the wafer W has sufficiently been cleared of charging or not. If the measured AC voltage value is within the predetermined range, a judgment is made that the wafer W is sufficiently cleared of charging. As a result, releasing of the wafer W from the electrostatic chuck Ec is allowed. In this case, the lifting pins 5 are moved to the position protruded from the upper surface of the chuck plate 2. The wafer W is thus lifted off from the chuck plate 2 for complete releasing.

According to the above-mentioned embodiment, during a series of operations of placing the wafer W on the chuck plate 2, thereafter attracting the wafer W and performing processing thereon and, after the processing, releasing the attraction of the wafer W for further transferring it, the state of the wafer W can be constantly ascertained. Not only can it be possible to control the attraction and releasing of the wafer W to and from the chuck plate 2 before processing and after processing the wafer W, but also can it be possible to detect the cracking and chipping that may happen with the wafer W during processing. It is to be noted here that in case the chuck plate 2 is made, e.g., of silicon rubber, it is necessary to make the chuck voltage relatively high (e.g., 4 kV) when the wafer W is electrostatically attracted. In this case, in an example in which, as in the above-mentioned conventional example, the secondary side of the transformer of the AC power source unit is interposed in the positive (high-voltage side) output of the DC power source unit, there is a problem in that a high dielectric strength transformer will be required. This kind of transformer is large in size and cannot be packaged on a circuit substrate, resulting in a problem in that the power supply apparatus for the electrostatic chuck becomes larger in size. On the other hand, in the above-mentioned embodiment, a high dielectric strength transformer will not be required, to the advantage in downsizing the apparatus.

Figure 2:
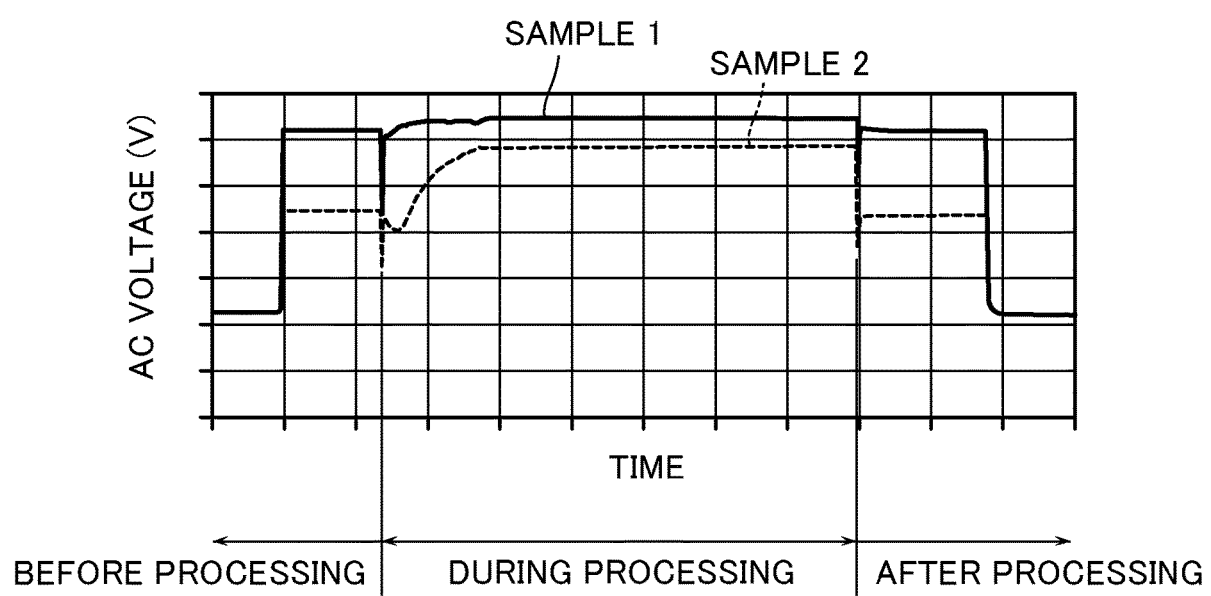
FIG. 2 is a graph showing the results of experiments for confirming the effects of this invention.

Next, in order to confirm the effects of this invention, the following experiment was carried out by using the electrostatic chuck Ec and the power supply apparatus $PS_1$ as shown in FIG. 1. In this experiment, the to-be-processed substrate was a wafer W, and the chuck plate 2 was made of silicon rubber. After having attracted the wafer W at a predetermined voltage (4 kV), processing utilizing plasma was attempted to be performed inside the vacuum chamber. A wafer W in a state which is free from cracking, chipping, positional deviation, and a foreign matter such as cracked pieces and the like of the wafer W is not interposed between the chuck plate 2 and the wafer W, is defined to be a Sample 1, and one in a state in which a foreign matter is interposed between the wafer W which is free from cracking and chipping and the chuck plate 2 is defined to be a Sample 2. According to the above-mentioned substrate control method, the changes in AC voltage were measured relating to the Samples 1 and 2, and the results are shown in FIG. 2. In FIG. 2 a solid line is the result of Sample 1, and a dotted line is the result of Sample 2.

According to these results, after having placed in position the Samples 1 and 2 respectively on the upper surface of the chuck plate 2, and the AC voltages were measured respectively before plasma processing. Then, it can be seen that, accompanied by the difference in the electrostatic capacitance, the AC voltage values measured with respect to Sample 1 and Sample 2 can be seen to be different from each other. In addition, similarly during plasma processing and after plasma processing, the AC voltage values measured with respect to Sample 1 and Sample 2 are different from each other accompanied by the difference in the electrostatic capacitance. According to the above-mentioned experiments, it was confirmed that the state of the wafer W could be constantly ascertained during a series of operations of having placed in position the wafer W on the chuck plate 2, of subsequently attracting the wafer W and performing processing thereon and, after the processing, of releasing the attraction of the wafer W for further transferring it.

Figure 3:
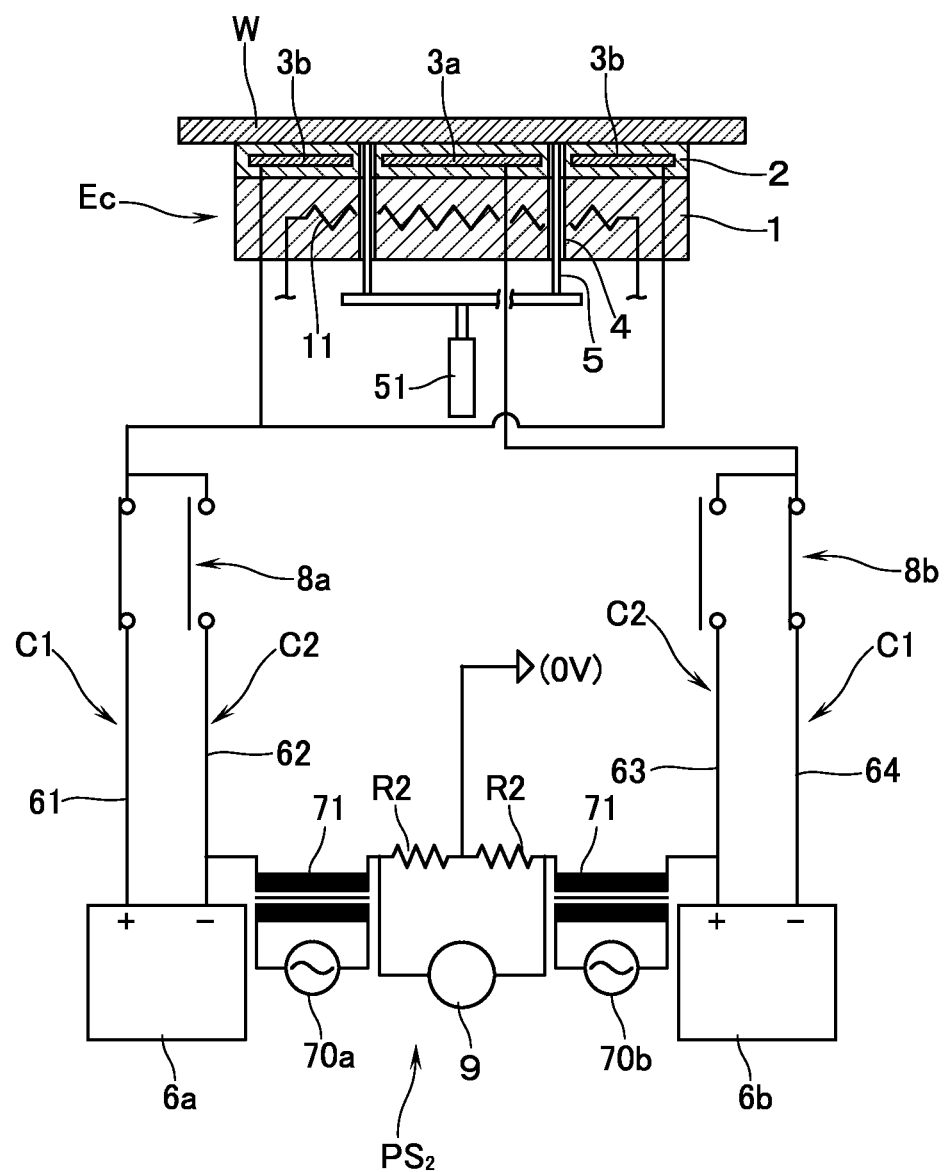
FIG. 3 schematically shows an arrangement of a power supply apparatus for an electrostatic chuck relating to a modified example of this invention.

Descriptions have so far been made of the embodiment of this invention, but this invention shall not be limited to the above. Within a range not deviating from the technical philosophy of this invention, modifications can appropriately be made. In the above-mentioned embodiment, a description was made on condition that the circuit that connects both the electrodes 3a, 3b to the ground potential for charge clearing of the wafer W after processing be defined as the second circuit C2. It shall, however, be not limited to the above, but may be arranged such that the second circuit C2 is constituted so as to connect both the electrodes 3a, 3b so that the pair of the electrodes 3a, 3b can be of the same potential. In addition, in the above-mentioned embodiment, a description was made of an example having a single AC power source unit 7, but it shall not be limited to the above. FIG. 3 shows a power supply apparatus PS$_2$ relating to a modified example. A description will be made by using the same reference marks regarding the same members and elements as the above-mentioned embodiment. A power supply apparatus PS$_2$ is provided with two AC power source units 70a, 70b of the same configuration. Both the AC power source units 70a, 70b are disposed in the second circuit C2 in series between the negative output 62 of one 6a of the DC power source unit and the positive output 63 of the other 6b of the DC power source unit. Then, between each of the AC power source units 70a, 70b there are connected in series two resistors R2, R2. While these resistors R2, R2 are connected to the ground potential (0V), a voltmeter 9 is connected in parallel with these resistors R2, R2. According to this arrangement, when AC current is caused to flow through the electrostatic capacitance to measure the AC voltage with the voltmeter 9, it is advantageously possible to make it hardly subject to the influence of the noises.

Figure 4:
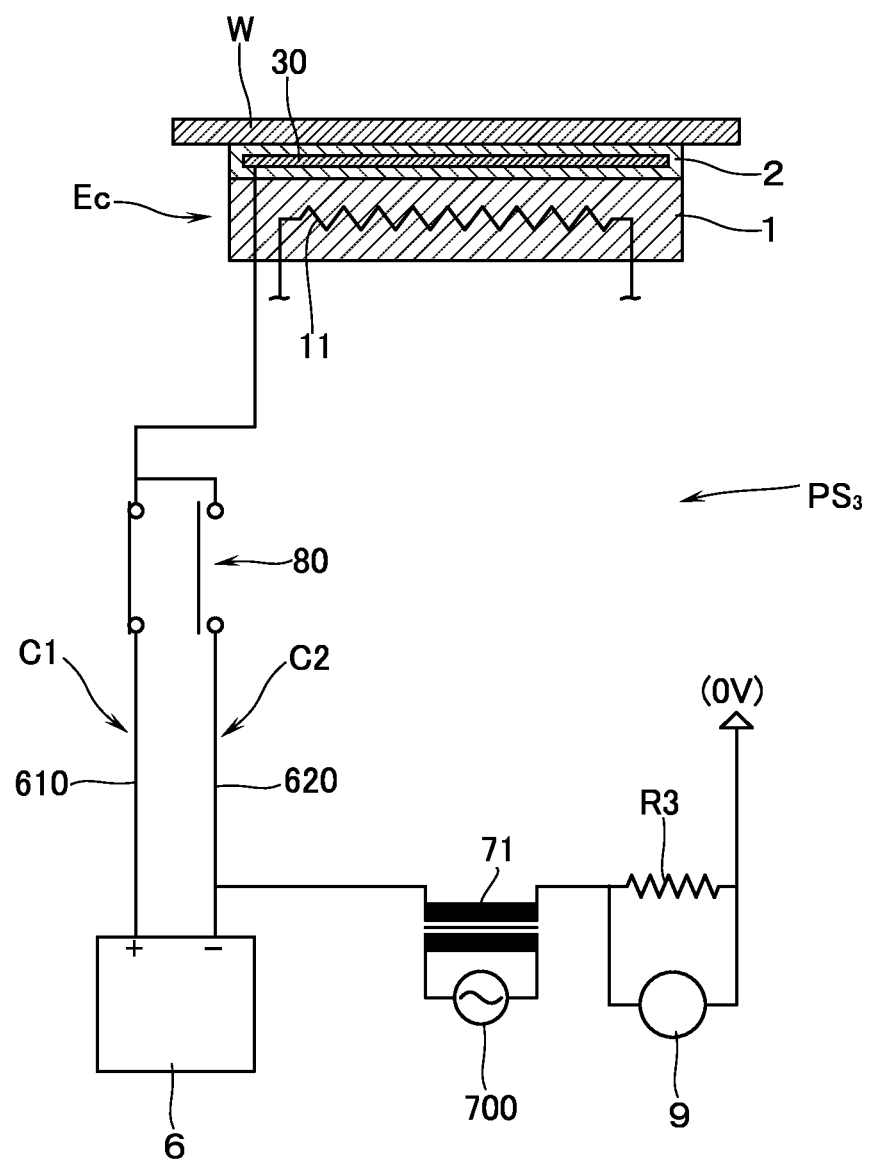
FIG. 4 schematically shows an arrangement of a power supply apparatus for an electrostatic chuck relating to another modified example of this invention.

Further, in the above-mentioned embodiment, a description was made of an example in which this invention was applied to a so-called bipolar type of electrostatic chuck, but this invention shall not be limited thereto but can be applied also to a single-pole type. FIG. 4 shows a power supply apparatus PS$_3$ relating to a further modified example in which power can be supplied to a single electrode 30 that is disposed in the chuck plate 2. The same reference marks are used, in the following explanations, with reference to the same material and element as in the above-mentioned embodiment. The power supply apparatus PS$_3$ is provided with a single DC power source unit 6, and the positive (high-voltage side) output of the DC power source unit 6 is connected to the electrode 30 through the switching means 80. A negative (low-voltage side) output 620 of the DC power source unit is also connected to the electrode 30 through the switching means 80, and has connected thereto an AC power source unit 700 and is connected to the ground potential (0V) through a resistor R3. A measuring device 9 such as a voltmeter and the like is connected in parallel with the resistor R3.

EXPLANATION OF MARKS

PS$_1$, PS$_2$, PS$_3$ power supply apparatus for electrostatic chuck
Ec electrostatic chuck
C1 first circuit
C2 second circuit
R1, R2, R3 resistor
W wafer (to-be-processed substrate)
3a, 3b electrode
6, 6a, 6b DC power source unit
7, 700 AC power source unit
8a, 8b switching means
9 voltmeter (measuring device)

The invention claimed is:

1. A power supply apparatus for supplying electric power to an electrostatic chuck which holds by attraction a to-be-processed substrate in a vacuum chamber, the power supply apparatus comprising:
    a DC power source unit for applying DC voltage to an electrode disposed in the electrostatic chuck;
    an AC power source unit for causing AC current to flow through an electrostatic capacitance of the electrostatic chuck;
    provided that a circuit for charging an electrode, from the DC power source unit, with chuck voltage to attract and hold in position the to-be-processed substrate be defined as a first circuit and that a circuit for charge clearing the to-be-processed substrate be defined as a second circuit,
    a switching means for switching between the first circuit and the second circuit, the second circuit being provided with the AC power source unit and a measuring device for measuring the AC current or the DC voltage
    wherein a secondary side of a transformer of the AC power source unit is interposed in the second circuit.

2. A power supply apparatus for supplying electric power to an electrostatic chuck which holds by attraction a to-be-processed substrate in a vacuum chamber, the power supply apparatus comprising:
    a DC power source unit for applying DC voltage to an electrode disposed in the electrostatic chuck;
    an AC power source unit for causing AC current to flow through an electrostatic capacitance of the electrostatic chuck;
    provided that a circuit for charging an electrode, from the DC power source unit, with chuck voltage to attract and hold in position the to-be-processed substrate be defined as a first circuit and that a circuit for charge clearing the to-be-processed substrate be defined as a second circuit,
    a switching means for switching between the first circuit and the second circuit, and
    the second circuit being provided with the AC power source unit and a measuring device for measuring the AC current or the DC voltage,
    wherein the electrode is constituted by a pair of electrodes, the positive and negative outputs of the DC power source unit are respectively connected to each of the electrodes through the switching means, and the second circuits have disposed in series two of the AC power source units, wherein resistors are disposed in series between both the AC power source units and a voltmeter as the measuring device is connected in parallel with the resistors.

3. A substrate control method for controlling attraction and releasing of a substrate to and from the electrostatic chuck by using a power supply apparatus for supplying electric power to an electrostatic chuck which holds by attraction a to-be-processed substrate in a vacuum chamber, the power supply apparatus having
- a DC power source unit for applying DC voltage to an electrode disposed in the electrostatic chuck,
- an AC power source unit for causing AC current to flow through an electrostatic capacitance of the electrostatic chuck,
- provided that a circuit for charging an electrode, from the DC power source unit, with chuck voltage to attract and hold in position the to-be-processed substrate be defined as a first circuit and that a circuit for charge clearing the to-be-processed substrate be defined as a second circuit,
- a switching means for switching between the first circuit and the second circuit, and
- the second circuit being provided with the AC power source unit and a measuring device for measuring the AC current or the DC voltage, the method comprising:

the step of: placing in position a to-be-processed substrate on the surface of the electrostatic chuck in a state in which switching has been made by the switching means to the second circuit; causing AC current by the AC power source unit to flow through the electrostatic capacitance, measuring by the measuring device AC current or AC voltage at this time; and, when the measured value is within a predetermined range, allowing DC voltage to be applied to the electrode;

the step of: switching by the switching means to the first circuit to apply chuck voltage from the DC power source unit to the electrode, thereby holding by attraction the to-be-processed substrate that is placed on the surface of the electrostatic chuck; after attraction, causing AC current to flow, by the AC power source unit, through the electrostatic capacitance of the electrostatic chuck; measuring by the measuring device AC current or AC voltage at this time to judge whether the measured value is within a predetermined range; and the step of: switching by the switching means to the second circuit for charge clearing the to-be-processed substrate and causing AC current to flow, by the AC power source unit, through the electrostatic capacitance of the electrostatic chuck; measuring by the measuring device AC current or AC voltage at this time; and, when this measured value is within a predetermined range, allowing the releasing of the to-be-processed substrate from the electrostatic chuck.

4. The power supply apparatus according to claim 1, the AC power configured to measure a state of the to-be-processed substrate before processing, and configured to judge acceptability of the to-be-processed substrate.

* * * * *